(12) United States Patent
Koshiba (10) Patent No.: US 6,437,986 B1
(45) Date of Patent: Aug. 20, 2002

(54) FUSE RELAY JUNCTION BLOCK FOR USE IN AUTOMOBILES

(75) Inventor: Kiyofumi Koshiba, Toyama-ken (JP)

(73) Assignee: Kojin, Ltd., Toyama-ken (JP)

( * ) Notice: Subject to any disclaimer, the term of this patent is extended or adjusted under 35 U.S.C. 154(b) by 0 days.

(21) Appl. No.: 09/655,181

(22) Filed: Sep. 5, 2000

(51) Int. Cl.$^7$ ............................................... H05K 5/00
(52) U.S. Cl. ...................... 361/752; 361/803; 361/775; 174/262; 174/265; 439/76.2; 439/76.1; 439/949
(58) Field of Search ................................. 361/752, 803, 361/775, 758; 439/949, 76.1, 76.2; 174/52.1, 262, 265, 266, 255

(56) References Cited

U.S. PATENT DOCUMENTS

| | | |
|---|---|---|
| 3,218,604 A | 11/1965 | Reimer |
| 3,388,464 A | 6/1968 | Pretty |
| 4,944,684 A * | 7/1990 | Leibowitz .................... 439/76 |
| 5,179,601 A | 1/1993 | Gotoh et al. |
| 5,442,142 A * | 8/1995 | Hayahi ...................... 174/250 |
| 5,476,395 A | 12/1995 | Raffles et al. |
| 5,872,333 A * | 2/1999 | Uezono et al. ............... 174/55 |
| 5,895,277 A | 4/1999 | Saka et al. |
| 5,902,138 A * | 5/1999 | Murakami .................. 439/76.2 |
| 5,995,380 A * | 11/1999 | Maue et al. ................. 361/826 |
| 6,162,990 A * | 12/2000 | Sakamoto ..................... 174/59 |
| 6,224,397 B1 * | 5/2001 | Nakamura ................. 439/76.2 |
| 6,290,509 B1 * | 9/2001 | Hattori et al. .............. 439/76.2 |

* cited by examiner

*Primary Examiner*—David Martin
*Assistant Examiner*—Thanh S. Phan
(74) *Attorney, Agent, or Firm*—Flynn, Thiel, Boutell & Tanis, P.C.

(57) ABSTRACT

There is provided a fuse relay junction block for use in automobiles capable of not only considerably reducing the number of assembling process but also realizing small sized, lightweight compact block, thereby enhancing reliability and achieving a low cost material by aggregating the conventional plural pieces of boards to form a multilayered circuit structure. The fuse relay junction block comprises a box cover having a plurality of connection ports through which wirings of electronic wiring systems are connected to terminals of wiring members and a plurality of filling ports for fuses, a box body engaged in the box cover, a multilayered board housed between the box cover and the box body, wherein said wiring members being arranged on not less than two layers of board and integrated with primary molded portions by insert molding to form a network structure, said network structure is subjected to an insert to form a secondary molded portion.

10 Claims, 6 Drawing Sheets

FUSE RELAY JUNCTION BLOCK FOR USE IN AUTOMOBILES

BACKGROUND OF THE INVENTION

1. Field of the Invention

The invention relates to a fuse relay junction block for use in automobiles to concentratedly control electric circuits of a variety of systems in the automobiles.

2. Related Art

There has been increasing a tendency that electronic devices or electric parts are mounted on automobiles to enhance fuel economy, anti-pollution measure, drivability, comfortableness in an interior space or the like. Electric wiring systems for driving the electric parts, electronic devices are complex in an engine room or in a car. Further, there has been considerably increasing a tendency that line brakes such as fuses, relays that are used for protecting these electric parts and electronic devices from overcurrent thereof.

Fuse relay junction blocks (that is also called a fuse relay control box, a fuse relay box or a fuse relay box) are divided into and installed on two blocks of an interior electrical wiring system and an engine room electrical wiring system, and wiring systems amount to 500 to 100 and they increase every year so that the fuse relay junction block inevitably becomes large-sized and complex.

Figure 9:
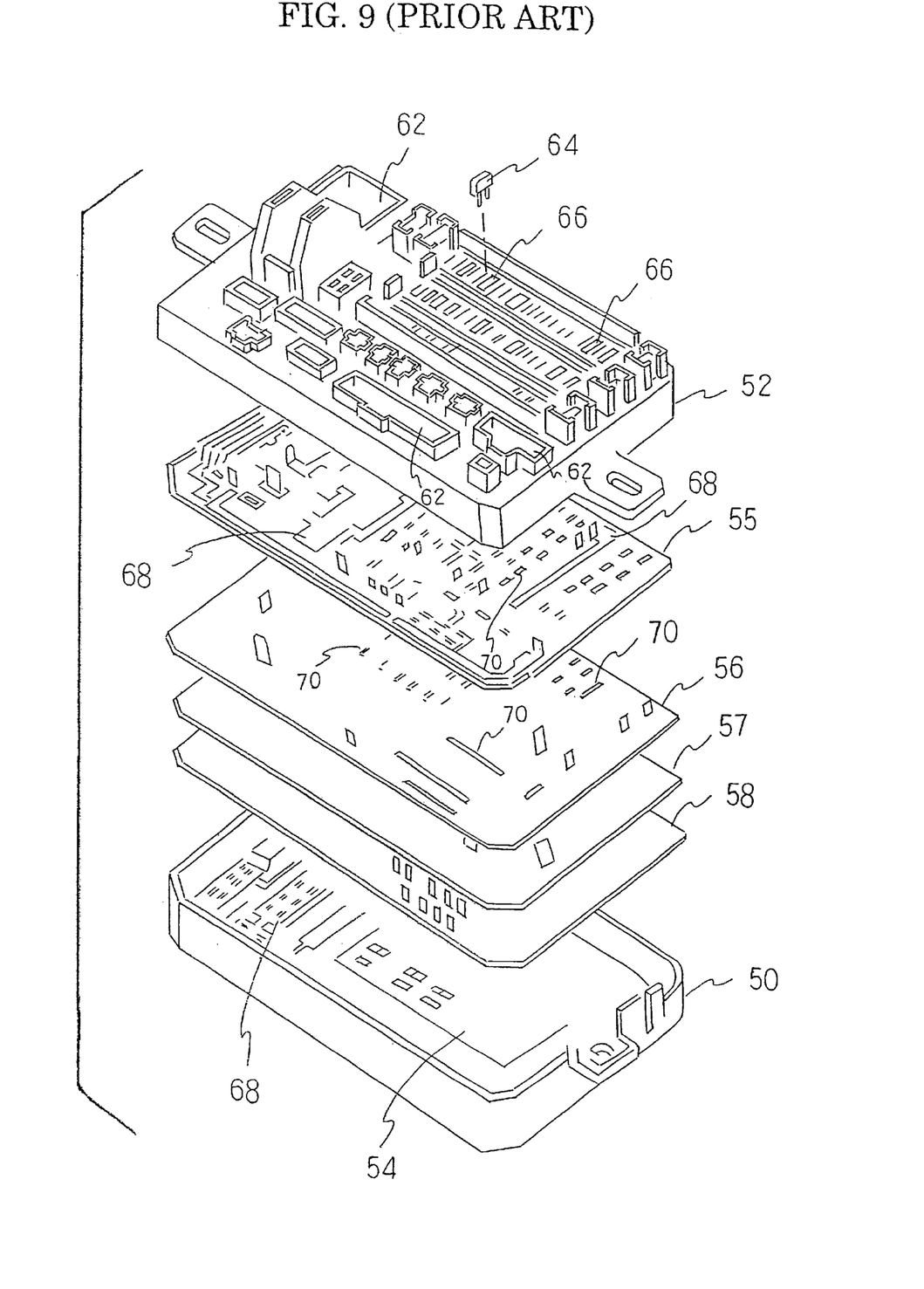
FIG. 9 is an exploded perspective view of a conventional fuse relay junction block.

FIG. 9 shows an example of a conventional fuse relay junction block wherein wiring boards (hereinafter simply referred to as boards) 54, 55 are housed in an inner bottom of a box body 50 and a downward recess of a box cover 52. Three middle boards 56, 57 and 58 are interposed between the boards 54, 55 to form a multilayer wiring board. The fuse relay junction block attains the size of a lunch box depending on the assemblage of these boards.

Provided on the upper surface of the box cover 52 are cable connection ports 62 through which cables from a variety of electrical wiring systems are connected, mounting ports arranged in three rows in which fuses are inserted, wherein respective electrical wiring systems are connected to corresponding fuses via wiring members 68 arranged on the respective boards 54 to 58 (in the case of the boards 56 to 58, they are arranged on lower surfaces thereof).

However, the conventional fuse relay junction block has the following problems.

It takes much trouble for arranging the wiring members on the boards 54 to 58 because recessed grooves are required for engaging the wiring members in the upper or lower surfaces of the respective boards to bond and fix the wiring members onto the recessed grooves. Further since the electronic devices and electric parts are arranged that (not in three dimensions) on each surface of each board, it is necessary to prevent these wiring members from getting entangled with one another, thereby forming a multilayer wiring board, namely, forming an assemblage of many boards as shown in FIG. 9.

There is provided on each boards slits 70 through which terminals serving as input/output portions of each wiring member provided on the other board are passed and the respective boards get in contact with one another by vertically arranged wiring members respective slits 70. When assembling the boards, the terminals are required to be inserted into or passed through the slits 70, resulting in much trouble.

Further, if the member of a board increases, there arises a problem that not only the number of molding increases, but also an outside air enters between boards to cause wiring members to corrode, thereby degrading durability and reliability in safety.

Still further, conventional wiring members are fixed to boards each formed of resin or the like by the means of the thermal deposition and expose terminal ends thereof through which fuses or the like are inserted from slits of an armoring case. Accordingly, the wiring members are prone to be rickety, and hence they are required to employ a material having an excellent elasticity as conductive terminals for inserting the terminals of the fuse or the like thereinto so as to fix and hold the fuse or the like to the wiring members. Accordingly, the conventional wiring members (conductive members) employ a copper alloy material composed of Cu and small amount of other metals such as Mg, Sn, Ni, P that are added to Cu so as to have elasticity (spring back property), causing a problem of high cost of materials.

SUMMARY OF THE INVENTION

The invention has been developed to solve the foregoing problems, and it is an object of the invention to provide a fuse relay junction block for use in automobiles capable of not only considerably reducing the number of assembling process but also realizing small sized, lightweight compact block, thereby enhancing reliability and achieving a low cost material by rendering the conventional plural boards intensive or aggregating the conventional plural boards to form a multilayered circuit structure.

To achieve the above object, the invention provides the fuse relay junction block for use in automobiles comprising a box cover having a plurality of connection ports through which wirings of electronic wiring systems are connected to terminals of wiring members, and a plurality of filling ports for fuses, a box body, a multilayer wiring board housed between the box cover and the box body, wherein said wiring members being arranged on not less than two layers of board and integrated with primary molded portions by insert molding to form a network structure, said network structure is subjected to an insert to form a secondary molded portion.

With the construction of the invention, viewed from the angle of the network structure, the primary molded portions formed by the insertion molding decide not only positions between the mutual wiring members on the respective layers of board but also intervals between the mutual wiring members arranged between the respective layers of board, thereby reducing troubles involved in manually arranging the wiring members on the respective boards and involved in assembling plural boards by piling up the plural boards.

Further, it is relatively free to design wiring members on the same layer of board so that the wiring members can be crossed with one another in three dimensions on the same layer of board. Still further, since the extraction pores through which a material of the primary molded portion is filled is provided on the respective wiring members, the stability of the configuration of the network structure is maintained to easily perform a secondary molding. More still further, since the material of the wiring members are composed of pure copper, the fuse relay junction block can be manufactured at low cost in view of a material.

PREFERRED EMBODIMENT OF THE INVENTION

A fuse relay junction block according to a first embodiment of the invention is now described with reference to FIGS. 1 to 5.

Figure 1:
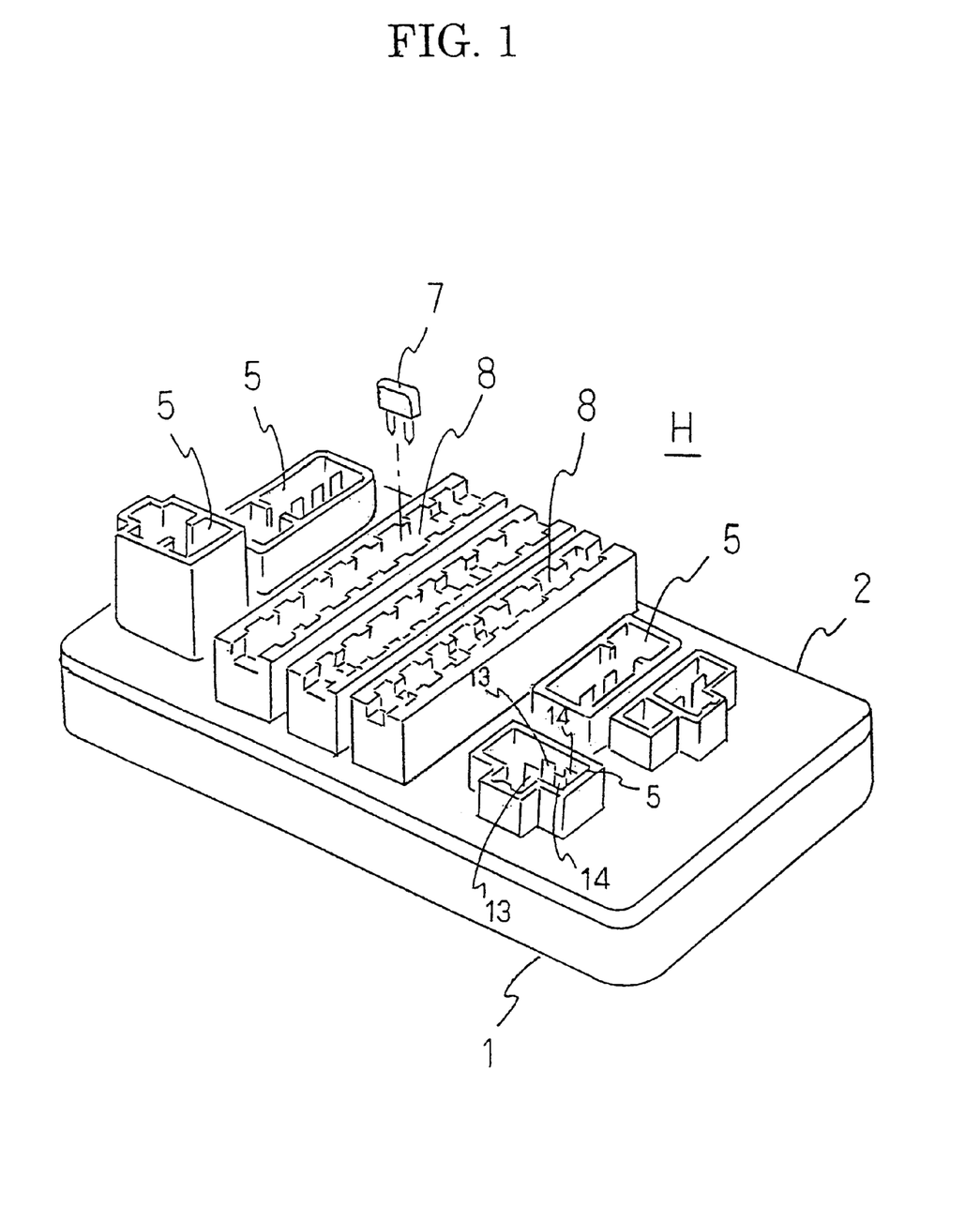
FIG. 1 is a perspective view of a fuse relay junction block according to a first embodiment of the invention.
Figure 2:
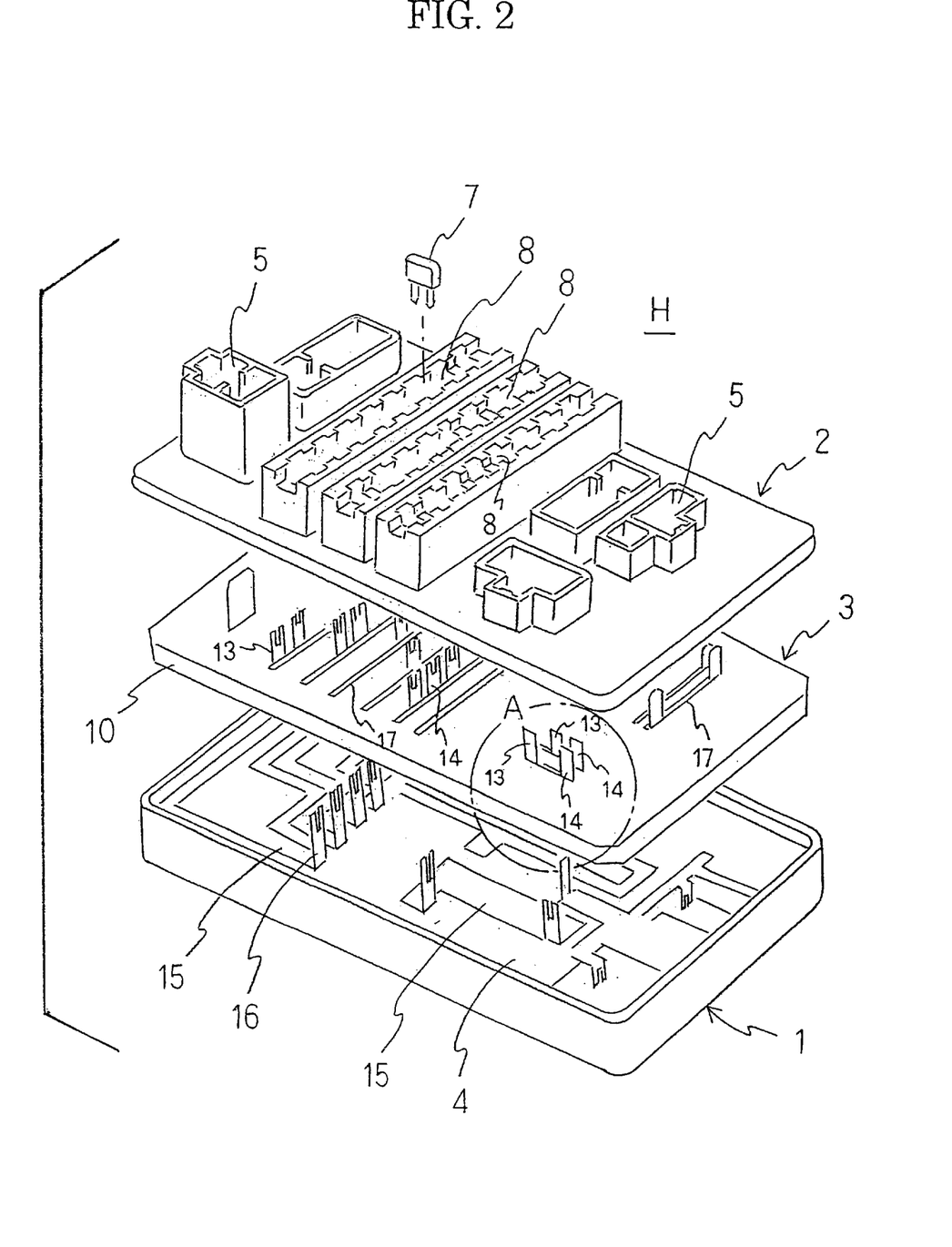
FIG. 2 is an exploded perspective view of the fuse relay junction block in FIG. 1.

A fuse relay junction block H comprises a box body 1, a box cover 2 and a multilayered board 3 (see FIG. 2). The box body 1 has a board 4 housed therein and the box cover 2 has connection ports 5 for wirings from electrical wiring systems protruded therefrom and a plurality of mounting ports 8 for fuses 7 arranged thereon. Terminals 13, 14 of wiring members 11, 12 provided on the multilayered board 3 directly protrude into the connection ports 5 (see FIG. 1), and terminals 16 of wiring members 15 provided on the board 4 protrude into slits 17 provided on the multilayer wiring board 3, thereby assembling the fuse relay junction block H (see FIG. 1).

The multilayer wiring board 3 forming the principal part of the invention is covered with a secondary molded portion 10 (see FIGS. 4 and 5) for inserting a network structure 9 (FIG. 3) and it comprises two layers although it has conventionally comprised three layers. That is, the multilayer wiring board 3 is improved by aggregating the boards from three boards to two boards. The improvement or reduction of the number of layer of board is caused by the network structure 9.

Figure 3:
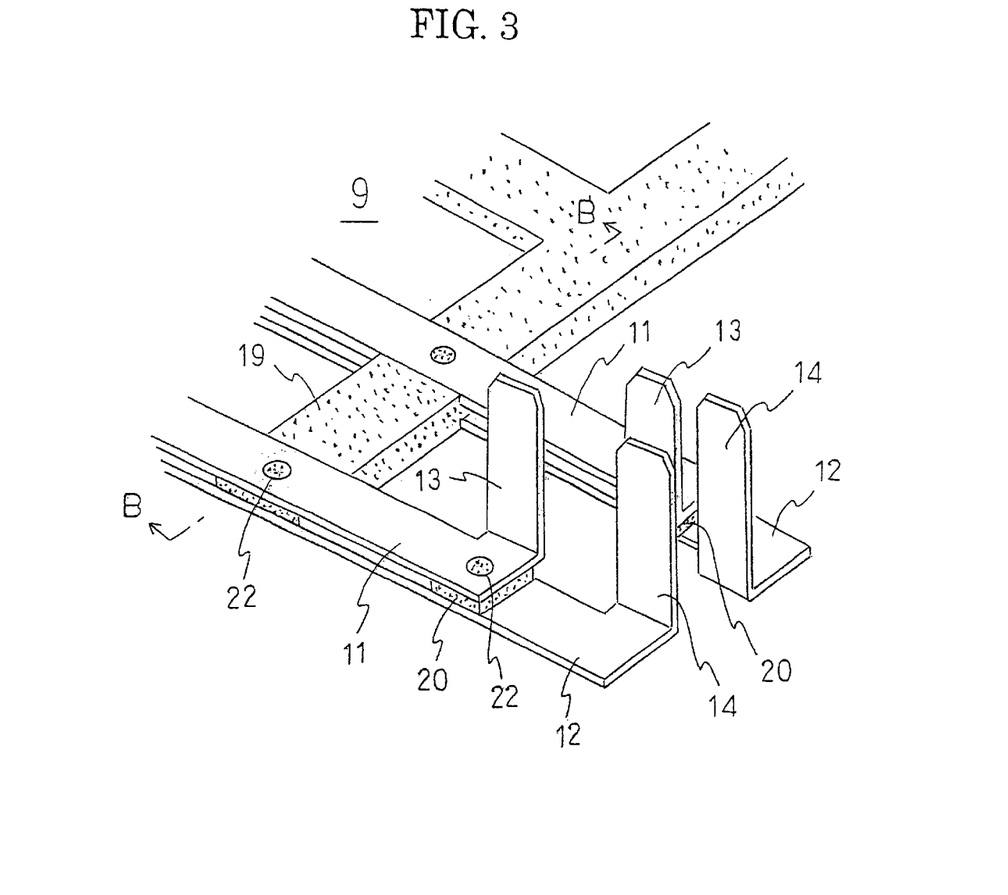
FIG. 3 is a perspective view of a network structure as depicted by the portion A in FIG. 2.
Figure 4:
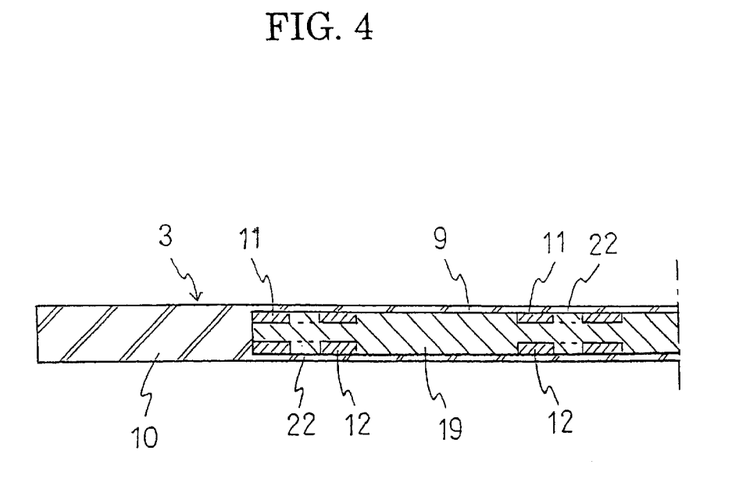
FIG. 4 is a sectional view showing a multilayer wiring board taken along lines B—B in FIG. 3.
Figure 5:
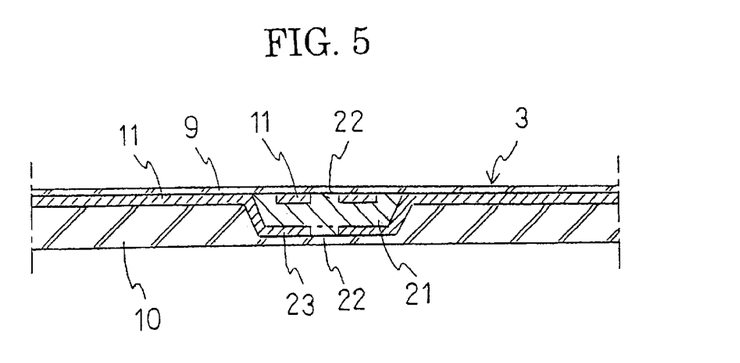
FIG. 5 is a sectional view showing a multilayer wiring board in another portion.

In the network structure 9, wiring members 11 on an upper layer of board and wiring members 12 on a lower layer of board are positioned up and down and maintained in parallel with each other vertically by a given interval therebetween and also they are maintained horizontally as well as vertically by primary molded portions 19, 20, 21 so as to form a net-like integrated structure. The primary molded portions 19, 20, 21 are formed of a primary rib mold 19, primary spot molds 20 and primary fork molds 21, and they are basically used for connecting the wiring members 11, 12.

The primary rib mold 19 forms an entire skeleton of the multilayer wiring board 3 and maintains a net-like structure as a whole. In the case shown in FIG. 4, the parallely arranged wiring members 11 on the upper layer of board are connected to each other by the primary rib mold 19 and wiring members 11, 12 on the upper and lower layers of board are also connected to each other by the primary rib mold 19, and hence the primary rib mold 19 extends longitudinally and latitudinally as a whole. The primary spot molds 20 serve as auxiliary molds of the primary rib mold 19 to connect the wiring members 11, 12 on the upper and lower layers of board partially at the portions slightly remote from the primary rib mold 19.

The primary spot molds 21 have bent portion 23 for allowing one side wiring members 11 to detour the other side wiring members 11 so as to cross the wiring members 11 on the upper layer of board with each other in three dimensions, and they are connected to each other at the bent portion 23. The bent portion 23 allows one wiring member 23 to detour around another wiring member to be insulated from one another or for differentiating the wiring members 23 of one level from another level. Extraction pores or ports 22 are provided in the wiring members 11, 12 on the upper and lower layers of board so as to fill a material of the primary molded portions 19, 20, 21 therein to enforce the connection between the wiring members 11, 12. The extraction ports 22 are formed by bores extending through the wiring members.

Since the wiring members on the same layer of board can be crossed with one another by the intervention of the primary spot molds 21, the number of the wiring members on the same layer of board, and a flexibility of the configuration thereof can be obtained so that three layers of board can be aggregated to two layers of board.

Figure 6:
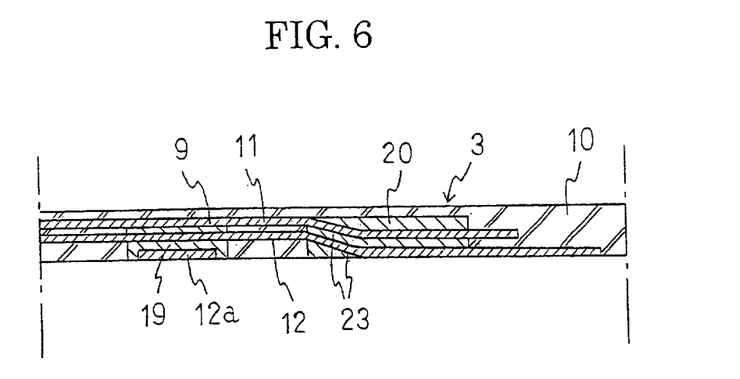
FIG. 6 is a partial sectional view showing a multilayer wiring board according to a second embodiment of the invention.

FIG. 6 shows a case of three-layered structure. Two wiring members 11, 12 of the wiring members 11, 12, 12a are designed to extend the lower layer of board by the bent portion 23.

Figure 7:
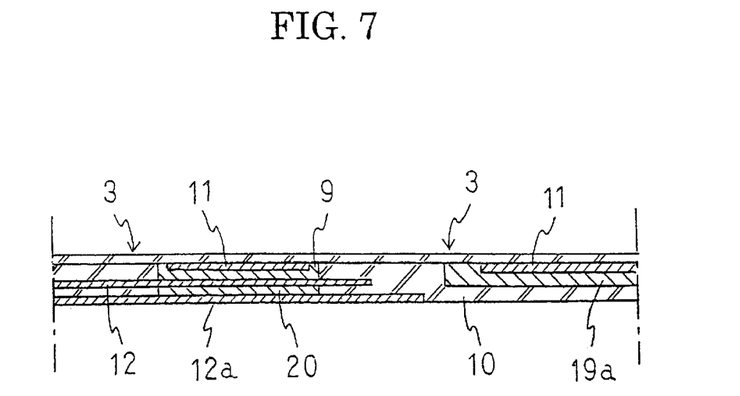
FIG. 7 is a partial sectional view showing a multilayer wiring board according to a third embodiment of the invention.

In the case shown in FIG. 7, the primary molded portion 19a which are separately formed from the network structure 9 is assembled with the network structure 9, thereby coping with a diversification of wirings.

Figure 8:
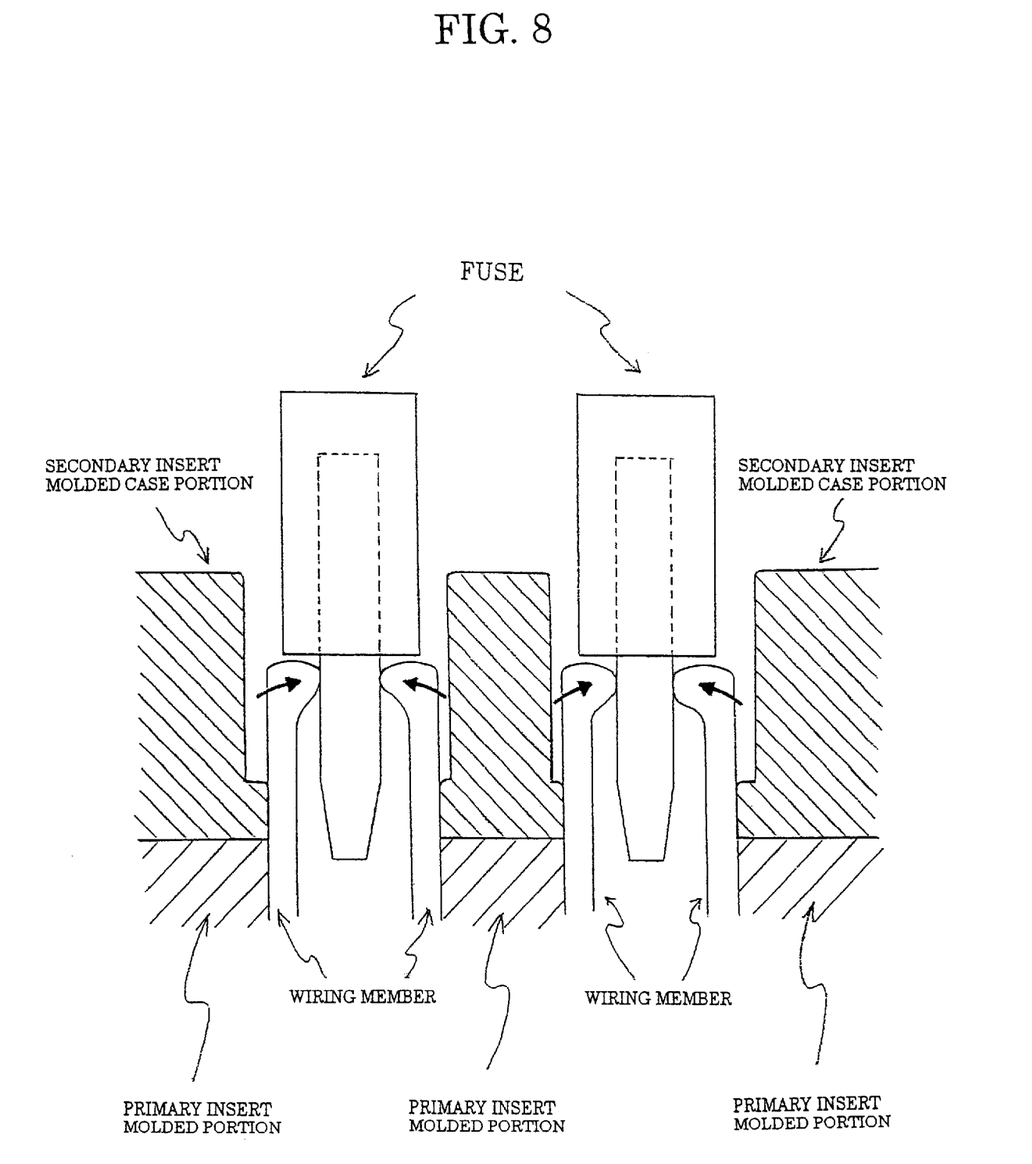
FIG. 8 is a sectional view explaining how to insert fuses into terminals of wiring members according to the fuse relay junction block of the invention.

FIG. 8 is a sectional view explaining how to insert fuses into terminals of wiring members according to the fuse relay junction block of the invention. According to the embodiment, since the roots of the wiring members are molded and fixed by the primary insert molding, and they are further reinforced and fixed by an armoring or secondary molding, a special metal material requiring an elasticity as depicted by arrows in FIG. 8, thereby reducing a manufacturing cost.

That is, although there has been employed a copper alloy formed of special metals such as Mg, Sn, Ni, P added to Cu as a material of a conventional wiring members, only pure copper is sufficient according to the invention. As a result, it is possible to reduce the cost of material of conductive members (wiring members) by about 40%.

As described in detail above, although a multilayer wiring board 3 is formed in the manner that the number of arranged layers of board on which the wiring members 11, 12 are provided becomes not less than 2 such as 2, namely, the multilayer wiring board 3 is formed of a two-layered, threelayered, or four-layered board depending on the number of electrical wiring systems of the automobiles, and hence the fuse relay junction block of the invention becomes compact because the number of the layers of board can be reduced compared with the conventional fuse relay junction block. The network structure 9 for enabling such compact structure may be formed by aggregating the entire wiring members of the fuse relay junction block or aggregating a part thereof excluding the board 4 housed in the box body 1 as shown in the embodiments.

The primary molded portions 19, 20, 21 are partially arranged by molding them at the same time in the same mold in the first embodiment shown in FIGS. 1 to 5, they can be molded integrally such as by insert molding, or they may be molded separately and assembled later to form the network structure 9 (FIG. 7). The primary molded portions are formed of an insulative material and preferably are formed of a synthetic resin but may be formed of rubber, ceramics or the like.

As set forth above in detail, since the fuse relay junction block according to the invention comprises one piece of multilayer wiring board by aggregating a conventionally employed plurality of boards, it is possible to reduce the troubles involved in arranging the wiring members or assembling the boards, thereby reducing the number of assembling process to achieve a low cost. Further, since the design of wirings becomes free, the fuse relay junction block can be small sized, lightweight, and compact so as to be easily installed on automobiles, and also it become high reliable. Still further, since a material of the wiring members as conductive members can be formed of a general material of a pure copper, there is an advantage that the cost of the material can be reduced by about 40%.

What is claimed is:

1. A fuse relay junction block for use in automobiles comprising:
    a box cover having a plurality of connection ports and a plurality of filling ports for fuses;
    a box body engaged with the box cover;
    a multilayer wiring board which is housed between the box cover and the box body and comprises wiring members, said wiring members including terminals that are accessible through said connection ports such that wirings of electric wiring systems which are disposed on the exterior of said box cover are insertable through said connection ports for engagement with said terminals, said wiring members having a plate-like shape, a plurality of said wiring members being disposed in two or more wiring layers and being coupled to each other by primary molded portions which are molded to said wiring members, at least a portion of said plurality of said wiring members having extraction ports which are filled by said primary molded portions to strengthen the coupling between said wiring members and said primary molded portions, said primary molded portions being of an insulative material, and said wiring members and said primary molded portions being mutually fixed together to define an open network structure which has openings between said wiring members as to be see-through vertically;
    said wiring board further comprising a secondary molded portion which is formed of an insulative secondary molded material and covers said open network structure by molding in a plate-like shape to define a final shape for said multilayer wiring board; and
    at least a portion of said plurality of said wiring members having bent portions which allow one said wiring member to be separated and insulated from another said wiring member or for differentiating one said wiring member in one said wiring level from another said wiring member in another said wiring level.

2. The fuse relay junction block according to claim 1, wherein a material of the wiring members is formed of pure copper.

3. The fuse relay junction block according to claim 1, wherein said secondary mold material fills said openings of said network structure.

4. The fuse relay junction block according to claim 1, wherein said box body and said box cover are separate components which are joined together to define an interior compartment, said multilayer wiring board being disposed within said interior compartment.

5. The fuse relay junction block according to claim 1, wherein all of said wiring members of said multilayer wiring board are fixed together in said open network structure by said primary molded portions independently of the presence of said secondary molded portion, said secondary mold portion being provided such that said openings between said wiring members are filled in said final shape.

6. A fuse relay junction block for use in automobiles comprising:
    a box cover having a plurality of connection ports and a plurality of filling ports for fuses;
    a box body which is assembled together with said box cover;
    a multilayer wiring board which is housed between the box cover and the box body and comprises a plurality of wiring members, said wiring members including terminals that are accessible through said connection ports such that wirings of electric wiring systems which are disposed on the exterior of said fuse relay junction block are insertable through said connection ports for engagement with said terminals, said wiring members having an elongate plate-like shape wherein a plurality of said wiring members are disposed in two or more wiring layers in spaced apart relation which said wiring layers are spaced apart in any of a direction of the thickness of said multilayer wiring board, a longitudinal direction extending between opposite end edges of said multilayer wiring board and a lateral direction extending between opposite side edges of said multilayer wiring board, primary molded portions formed of an insulated material being coupled to said wiring members to maintain said wiring members in said spaced apart relation wherein said coupled wiring members and primary molded portions define an open network structure with spaces being provided between said wiring members in any of said thickness direction, said longitudinal direction and said lateral direction;

said wiring board further comprising a secondary molded portion which is formed of an insulative secondary mold material molded over said open network structure to cover said open network structure such that said secondary mold material fills said spaces within said open network structure and defines a final board shape for said multilayer wiring board.

7. The fuse relay junction block according to claim 6, wherein at least a portion of said wiring members include extraction ports therethrough in a region of said primary molded portions such that a primary mold material from which said primary molded portions is formed fills said extraction ports to strengthen the coupling between said primary molded portions and said wiring members.

8. The fuse relay junction block according to claim 7, wherein at least a portion of said wiring members include bent portions to maintain said wiring members in one said wiring level in spaced relation or to extend one said wiring member from one said wiring level to another said wiring level.

9. The fuse relay junction block according to claim 6, wherein all of said wiring levels of said multilayer wiring board are defined by said open network structure.

10. A method of manufacturing a fuse relay junction block for use in automobiles comprising a box cover having a plurality of connection ports through which wirings of electric wiring systems are connected to terminals of wiring members and having a plurality of filling ports for fuses, a box body engaged with the box cover, a multilayer wiring board housed between the box cover and the box body, said method comprising:

assembling the multilayered wiring board, said assembly step comprising:
  forming the wiring members in a plate-like band shape;
  arranging a plurality of the wiring members in at least two layers in preparation of molding;
  providing an insulating material to the wiring members in a primary insert molding step, whereby the wiring members are coupled to primary molded portions defined by the insulating material to form a vertically see-through network structure with the wiring members held in a mutually fixed positional relation;
  subjecting the network structure to a secondary insert molding step wherein the network structure is covered with an insulating material in a plate-like shape, thereby forming the multilayer wiring board;
when arranging the wiring members during the primary insert molding step, said method further comprising the steps of:
  integrating the wiring members with each other wherein each said wiring member has a bent portion for allowing one said wiring member to detour around another wiring member so as to be insulated from each other or for differentiating said wiring members in one said level from said wiring members in another said level; and
  providing the wiring members with extraction ports which are filled therethrough with the primary molded portions during said primary insert molding step for strengthening the coupling between the wiring members and the primary molded portions.

\* \* \* \* \*